United States Patent [19]

Takada et al.

[11] Patent Number: 4,685,203

[45] Date of Patent: Aug. 11, 1987

[54] HYBRID INTEGRATED CIRCUIT SUBSTRATE AND METHOD OF MANUFACTURING THE SAME

[75] Inventors: Mitsuyuki Takada; Yoshiyuki Morihiro; Hayato Takasago, all of Amagasaki, Japan

[73] Assignee: Mitsubishi Denki Kabushiki Kaisha, Tokyo, Japan

[21] Appl. No.: 636,675

[22] Filed: Aug. 1, 1984

[30] Foreign Application Priority Data

Sep. 13, 1983 [JP] Japan .............................. 58-169702
Sep. 13, 1983 [JP] Japan .............................. 58-169703

[51] Int. Cl.$^4$ ......................................... H01C 17/06
[52] U.S. Cl. ......................................... 29/620; 427/98; 427/102; 427/304
[58] Field of Search .................. 29/620, 846, 847; 427/98, 102, 304

[56] References Cited

U.S. PATENT DOCUMENTS

| | | | |
|---|---|---|---|
| 3,594,222 | 7/1971 | Waits | 29/620 |
| 3,676,213 | 7/1972 | Marton | 427/98 |
| 3,698,940 | 10/1972 | Mersereau et al. | 427/98 |
| 4,278,725 | 7/1981 | Riley et al. | 29/620 |
| 4,378,384 | 3/1983 | Murakami et al. | 427/98 |
| 4,526,810 | 7/1985 | Nesbitt | 427/98 |
| 4,532,152 | 7/1985 | Elarde | 427/98 |

*Primary Examiner*—Percy W. Echols
*Attorney, Agent, or Firm*—Lowe Price LeBlanc Becker & Shur

[57] ABSTRACT

A hybrid integrated circuit substrate comprising an insulating substrate. On predetermined positions of the upper surface of the substrate, there are formed cermet resistors and activation layers to be in contact with ends of the resistors. On predetermined positions of the upper surface of the activation layers, there are formed conductor layers electrically connected with the ends of the resistors through the activation layers. The activation layers are formed from an activation paste containing a catalytic metal for enabling deposition in electroless plating in glass ingredients for attaining adhesion with the insulating substrate upon firing. Electrical connection between the conductor layers and the cermet resistors occurs through the activation layers by ohmic contact effected between the cermet resistors and the conductor layers through diffusion layers formed upon firing the activation paste.

10 Claims, 9 Drawing Figures

HYBRID INTEGRATED CIRCUIT SUBSTRATE AND METHOD OF MANUFACTURING THE SAME

BACKGROUND OF THE INVENTION

1. Field of the Invention

The present invention relates to a hybrid integrated circuit substrate and a method of manufacturing the same, and more particularly, it relates to a low-cost and highly reliable hybrid integrated circuit substrate and a manufacturing method thereof.

2. Description of the Prior Art

Generally, as circuit substrates of the above type, there have hitherto been used a thick film hybrid integrated circuit substrate formed by utilizing a thick film forming process in which thick film conductor paste or thick film resistive paste is printed and fired on an insulating heat-resistant substrate such as an alumina ceramic substrate, a thin film hybrid integrated circuit substrate formed by utilizing a thin film forming process such as vapor deposition and sputtering, a combined hybrid integrated circuit substrate in which a thick film and a thin film are combined and another type of hybrid integrated circuit substrate in which polymer printing resistors are formed on, e.g., a paper phenol substrate.

The thin film hybrid integrated circuit substrate as used in the field requires high reliability, high efficiency and fine line patterns mainly for industrial electronic devices, and is costly in comparison with the thick film hybrid integrated circuit substrate which is formed by printing and firing, utilizing paste of noble metals such as silver-palladium, platinum-palladium or gold in conductor layers and cermet resistive paste such as ruthenium oxide in the resistors.

Further, a thick film resin circuit substrate formed by printing polymer printing resistors on an organic substrate, such as paper phenol, and curing the same to be combined with conductor patterns prepared by etching of a copper foil or printing and curing of silver polymer paste, for example, is used in non-industrial fields mainly for saving cost. However, such a thick film resin circuit substrate is inferior in efficiency and reliability to those having cermet resistors and thin film resistors fired at high temperatures since it requires resistors of a type cured at a low temperature. Further, this type of circuit substrate has inferior thermal radiation properties and thus cannot be used for a power supplier. Therefore, application thereof is inevitably limited to consumer devices to save cost.

In the aforementioned thick film hybrid integrated circuit substrate, the range of resistance values can be increased by utilizing cermet resistors of, e.g., ruthenium oxide. Further, this type of substrate is highly efficient and highly reliable since it is fired at a high temperature over 500° C., and is used in most of the consumer and industrial fields.

However, the thick film hybrid integrated circuit substrate is costly since a noble metal is used for the conductor layers. Further, there is a disadvantage in that silver mainly used for the conductor layers is melted in molten solder when circuit elements are soldered to the conductor layers. Therefore, utilization of solder containing silver is required while the soldering process must be carefully controlled with respect to, e.g., temperature control.

In substitution for the above noble metal paste, base metal pastes of, e.g., copper and nickel may be used for the conductor layers of the thick film hybrid integrated circuit substrate to reduce the cost and lower the impedance of the conductor layers. In this case, however, the substrate must be fired in a nitrogen atmosphere, and development of applicable resistive paste is required.

The descriptions which are of interest to the invention can be found in the following documents. Japanese Laying-Open Gazette No. 93296/1983, "Method of Manufacturing Multilayer Wiring Substrate" discloses a Ti layer of 1000 Å in thickness and a Cu layer of 5000 Å in thickness formed on polyimide by sputtering and then a Cu pattern plating layer of 6 $\mu$m thickness is formed by using a resist, under the heat-resisting temperature of polyimide. "Polyimide Dielectric on Hybrid Multilayer Circuits" by John Shurboff, Motorola Inc., 1983 IEEE discloses application of polyimide to a hybrid IC. "Base Metal Thick Film Materials A Review of Their Technology & Applications" by Christopher R. S. Needes, E. I. Du Pont de Nemours & Co., Inc., IMC 1982 describes that a first conductor (Pd/Ag) is fired in air and subsequently a second conductor (Cu) is fired in nitrogen so that a Cu system is available.

SUMMARY OF THE INVENTION

According to the present invention, a hybrid integrated circuit substrate comprises an insulating substrate provided on predetermined areas thereof with resistors. On predetermined areas of the insulating substrate there are further formed activation layers in contact with ends of the resistors. On predetermined areas of the activation layers, there are formed conductor layers electrically connected with the ends of the resistors.

Accordingly, an essential object of the present invention is to provide a highly efficient and highly reliable hybrid integrated circuit substrate which can be readily manufactured at low cost.

Another object of the present invention is to provide a method of manufacturing a highly efficient and highly reliable hybrid integrated circuit substrate at a low cost.

According to the present invention, the conductor layers can be formed by plating with a base metal, whereby manufacturing cost is lowered and the conductor layers are not required to be formed in a specific atmosphere.

In a preferred embodiment of the present invention, resistors are first provided, so that the resistors can be accurately formed without causing any substantial unevenness of the substrate. Further, the substrate according to the present invention has excellent thermal radiation characteristics since the resistors can be formed in close contact with the surface of the substrate.

In another embodiment of the present invention, the resistors are cermet resistors.

In still another embodiment of the present invention, the resistors are formed in the last stage to prevent lowering in resistance characteristics during manufacturing.

The above and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
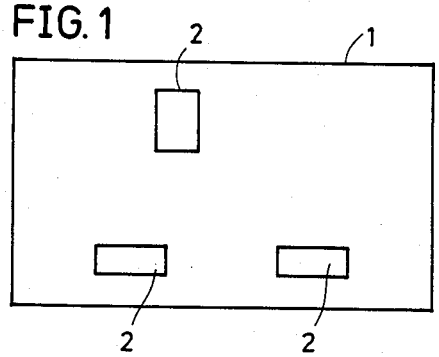
FIG. 1 is a plan view of an insulating substrate according to a first embodiment of the present invention.
Figure 2:
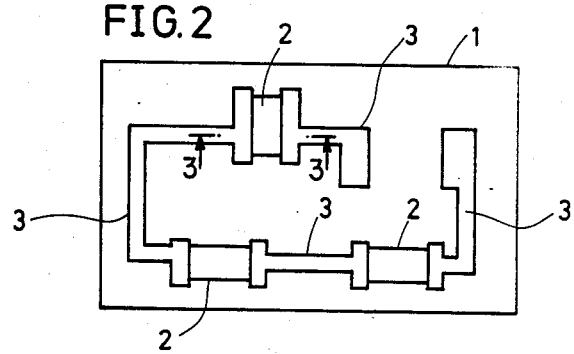
FIG. 2 is a plan view of a hybrid integrated circuit substrate according to the first embodiment of the present invention.
Figure 3:
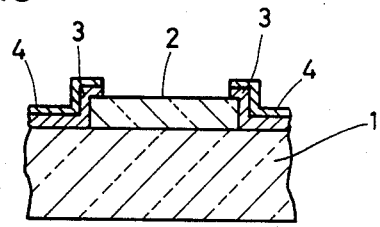
FIG. 3 is a partial cross-sectional view taken along the line III—III in FIG. 2.

A first preferred embodiment of the present invention is now described with reference to FIGS. 1 through 3 of the drawings. FIG. 1 is a plan view of an insulating substrate. FIG. 2 is a plan view of a hybrid integrated circuit substrate. FIG. 3 is a partial cross-sectional view taken along the line III—III in FIG. 2. In these drawings, there is shown an insulating substrate 1 formed by, e.g., an alumina ceramic substrate. The insulating substrate 1 is provided at predetermined positions thereon with resistors 2. In the present embodiment, the resistors 2 are cermet resistors of ruthenium oxide formed by firing. On the insulating substrate 1, activation layers 3, formed by printing, are in contact with the resistors 2 at the end portions thereof for enabling deposition in electroless plating. On the activation layers 3, there are formed conductor layers 4 utilizing at least electroless plating.

Description is now made in detail with respect to a method of manufacturing a hybrid integrated circuit substrate embodying the present invention with reference to FIGS. 1 through 3.

First, as shown in FIG. 1, resistive paste of ruthenium oxide is printed on predetermined positions of the alumina ceramic substrate 1 and fired at a temperature over 500° C., e.g., at 850° C., to form the cermet resistors 2. Then, activation paste is printed on the substrate 1 at positions to be provided with conductors in contact with the resistors 2 at the end portions thereof and fired to form the activation layers 3. The paste contains a catalytic metal for enabling deposition in electroless plating and glass ingredients for attaining adhesion with the base, i.e., alumina ceramic substrate 1 upon firing. Such paste may be prepared by, e.g., Catapaste CGP1630 manufactured by Okuno Seiyaku. The temperature for firing the activation paste is set to be lower by at least about 50° C. than that for firing the previously formed cermet resistors 2, whereby the substrate is protected from any harmful influence exerted by heat such as change in the resistance value, while diffusion layers are defined between the cermet resistors 2 and the activation layer 3. Thereafter the alumina ceramic substrate 1 is dipped in an electroless plating bath so that plated layers are formed exclusively on the activation layers 3, forming the conductor layers 4. A base metal such as copper or nickel is mainly used for the electroless plating. Thus, ohmic contact is effected between the cermet resistors 2 and the conductor layers 4 through the diffusion layers formed upon firing of the activation paste. In the aforementioned manner, there is formed a hybrid integrated circuit substrate comprising the resistors 2 and the conductor layers 4.

Figure 4:
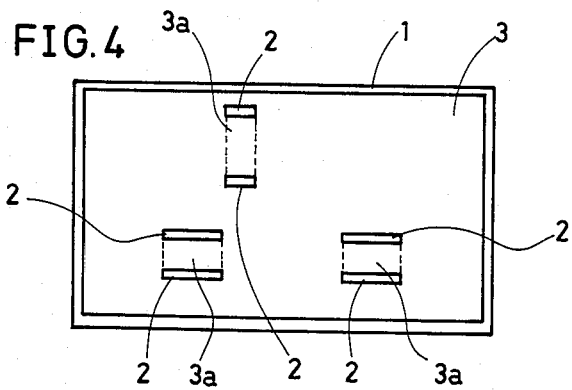
FIG. 4 is a plan view of an insulating substrate according to a second embodiment of the present invention.
Figure 5:
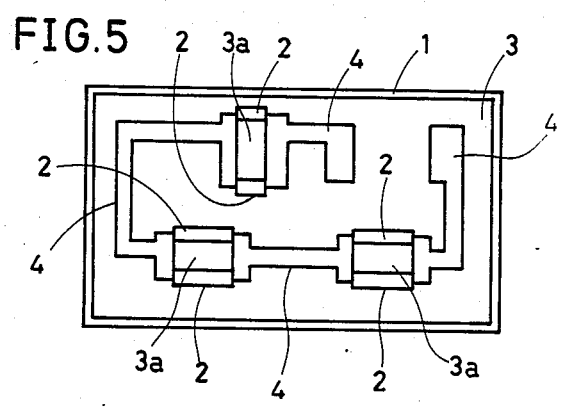
FIG. 5 is a plan view of a hybrid integrated circuit substrate according to the second embodiment of the present invention.

FIG. 4 is a plan view of an insulating substrate according to a second embodiment of the present invention and FIG. 5 is a plan view of a hybrid integrated circuit substrate according to the second embodiment of the present invention.

In the aforementioned first embodiment, the activation layers 3 are printed exclusively on positions to be provided with the conductor layers 4. On the other hand, in the second embodiment as shown in FIGS. 4 and 5, an activation layer 3 is printed over the entire surface of an alumina ceramic substrate 1 excepting positions in which resistors 2 are not in contact with conductor layers 4, i.e., positions 3a shown as surrounded by dotted lines in FIG. 4 and fired, whereafter the alumina ceramic substrate 1 is dipped in an electroless plating bath to form plated conductor layers 4 on the activation layer 3. Further, the conductor layer 4 may be provided thereon with resist layers (not shown) by a photoengraving process, to form patterned conductor layers 4 as shown in FIG. 5 by etching.

In the aforementioned manner, the conductor layers 4 can be subjected to fine line patterning.

Further, the conductor layers 4 in the first and second embodiments may be constituted by the first conductor layers formed by electroless plating and the second conductor layers formed on the first conductor layers by electroplating, whereby the thickness of thin films may be readily increased as desired and the impedance of the conductors can be lowered, while, further, the electric current capacity may be set at a high value and the patterns may be finely stated.

Figure 6:
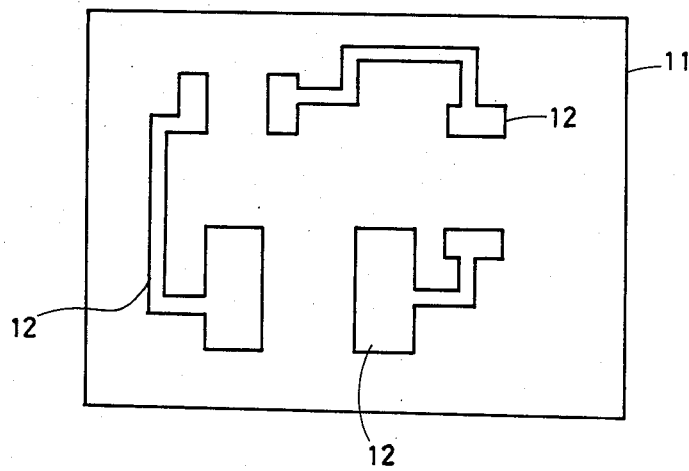
FIG. 6 is a plan view of an insulating heat-resistant substrate according to a third embodiment of the present invention.
Figure 7:
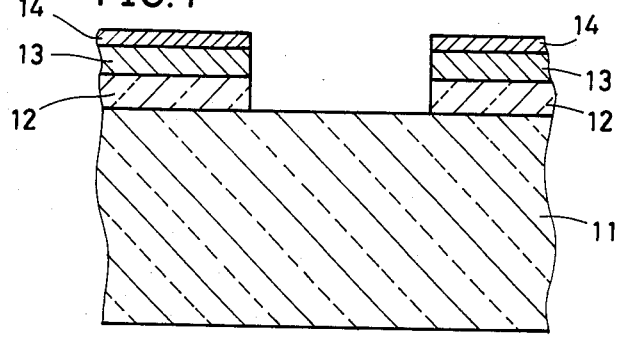
FIG. 7 is a partial cross-sectional view of the insulating heat-resistant substrate according to the third embodiment of the present invention.
Figure 8:
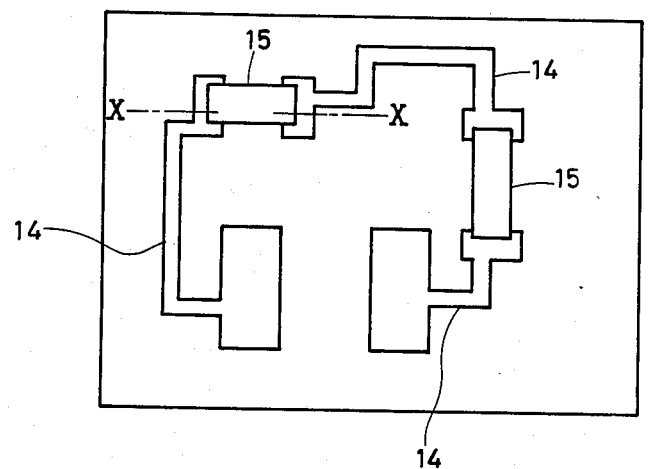
FIG. 8 is a plan view of a hybrid integrated circuit substrate according to the third embodiment of the present invention.
Figure 9:
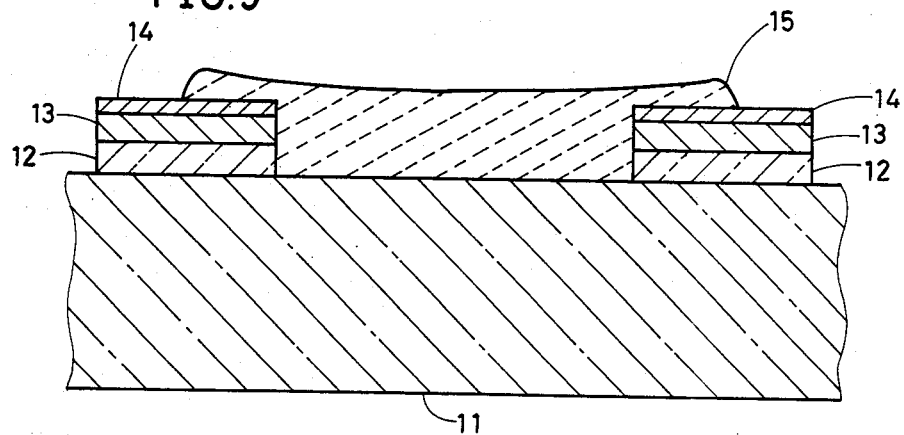
FIG. 9 is a partial cross-sectional view taken along the line X—X in FIG. 8.

In FIGS. 6 through 9, there is shown a third embodiment of the present invention. FIG. 6 is a plan view of an insulating heat-resistant substrate, FIG. 7 is a partial cross-sectional view of the insulating heat-resistant substrate, FIG. 8 is a plan view of a hybrid integrated circuit substrate and FIG. 9 is a partial cross-sectional view taken along the line X—X in FIG. 8. In these drawings, there is shown an insulating heat-resistant substrate 11 formed by, e.g., an alumina ceramic substrate. The insulating heat-resistant substrate 11 is provided thereon with activation layers 12 for enabling deposition in electroless plating. On the activation layers 12, there are formed conductor layers utilizing at least electroless plating. In the embodiment as shown in FIGS. 7 through 9, the conductor layers comprise first conductor layers 13 and second conductor layers 14, in which the first conductor layers 13 are prepared by use of the combination of nickel electroless plating, copper electroless plating and copper electroplating and the second conductor layers 14 are prepared by gold plated layers formed by electroless plating or electroplating. Cermet resistors 15 are further formed by firing on the insulating heat-resistant substrate 11 to be in contact with the first and second conductor layers 13 and 14 at the end portions thereof. The cermet resistors 15 may be of ruthenium oxide.

Description is now made in detail with respect to a method of manufacturing the hybrid integrated circuit substrate according to the third embodiment of the present invention, with reference to FIGS. 6 through 9.

First, as shown in FIG. 6, activation paste is printed on the alumina ceramic substrate 11 exclusively in positions requiring conductors and fired to form activation layers 12. The activation paste contains a catalytic metal for enabling deposition in electroless plating and glass ingredients for attaining adhesion with the base, i.e., the alumina ceramic substrate 11 upon firing. For example, the aforementioend Catapaste CGP1630 manufactured by Okuno Seiyaku may be used as the activation paste.

Then, the alumina ceramic substrate 11 is dipped in an electroless nickel plating bath, so that the first conductor layers 13 made of nickel plated layers are formed exclusively on the activation layers 12. Then the second conductor layers 14 made of gold plated layers are formed on the first conductor layers 13 by electroless plating or electroplating. The second conductor layers 14 made of gold plated layers are formed to prevent oxidation of the first conductor layers 13 during firing of cermet resistors 15 at a later step, as oxidation-resistant layers. FIG. 7 is a cross-sectional view of the substrate thus manufactured.

Then, as shown in FIGS. 8 and 9, resistive paste of ruthenium oxide is printed on predetermined positions of the alumina ceramic substrate 11 to be in contact with the first and second conductor layers 13 and 14 and is fired to form the cermet resistors 15. Although the resistors 15 are fired at a temperature over 500° C. in the air, e.g., at 850° C., the nickel plated first conductor layers 13 are effectively prevented from oxidizing since the gold plated second layers 14 are formed thereon as hereinabove described. Thus, the first and second conductor layers 13 and 14 are prevented from becoming increasing in resistance and from degraded in soldering ability, while satisfactory ohmic contact is effected between the first and the second conductor layers 13 and 14 and the resistors 15. In such a manner, there is formed a hybrid integrated circuit substrate comprising the cermet resistors 15 and the first and second conductor layers 13 and 14.

Description is now made with respect to a fourth embodiment of the present invention, which is a modification of the aforementioned third embodiment of the present invention. First, activation paste is printed over the entire surface of an alumina ceramic substrate 11 and is fired to form activation layers 12. Then, the alumina ceramic substrate 11 is dipped in a nickel electroless plating bath and subsequently in a copper electroless plating bath or a copper electroplating bath to form plated layers 13 over the entire surface of the substrate 11. Further, gold plated layers 14 are formed on the layers 13. Thereafter resist layers are formed on the gold plated layers 14 by a photoengraving process, whereby patterned first and second conductor layers 13 and 14 are obtained by etching.

Resistive paste of ruthenium oxide is then printed on predetermined positions of the alumina ceramic substrate 11 provided with the first and second conductor layers 13 and 14 and is fired to form cermet resistors 15. Thus, there is obtained a hybrid integrated circuit substrate comprising the cermet resistors 15 and the conductor layers 13 and 14, similar to the above third embodiment. In such a manner, the conductor layers can be subjected to fine line patterning. Although the activation paste is printed on the entire surface of the substrate 11 in the aforementioned embodiment, a similar effect may be attained by activation utilizing a liquefied activation agent capable of dipping and coating, e.g., Catapaste ccp-4200 manufactured by Okuno Chemical Industries Co. Ltd.

Further, the substrates obtained by the above third and fourth embodiments may be subjected to further printing and firing of activation paste in predetermined patterns, followed by plating for addition of further conductor layers.

Although electroless nickel plating is employed for the first conductor layers 13 in the third and fourth embodiments, copper plating, for example, may be substituted for the same. Further, electroplating may be effected on the electroless-plated layers to increase the film thickness as desired, to set the electric current capacity at a high value. In addition, the second conductor layers 14 are not limited to gold plated ones, but may be formed by any metal functioning to prevent oxidation of the first conductor layers 13 by heat generated during forming of the resistors 15, and may be prepared by plating of, e.g., platinum and silver.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a hybrid integrated circuit substrate comprising the steps of:
   preparing an insulating substrate;
   forming cermet resistors on predetermined positions of said insulating substrate by firing;
   forming activation layers for enabling deposition in electroless plating on said insulting substrate in contact with said resistors; and
   forming conductor layers on said activation layers utilizing at least electroless plating, wherein said activation layers are made of activation paste containing a catalytic metal for enabling deposition in electroless plating and glass ingredients for attaining adhesion with said insulating substrate upon firing, electrical connection between said conductor layers and said cermet resistors occurring through said activation layers by ohmic contact effected between the cermet resistors and the conductor layers through diffusion layers formed upon firing the activation paste.

2. A method of manufacturing a hybrid integrated circuit substrate in accordance with claim 1, wherein said conductor layers consist of first conductor layers formed on said activation layers by electroless plating and second conductor layers formed on said first conductor layers by electroplating.

3. The method of claim 2, wherein said first conductor layers consist of base metal.

4. The method of claim 1, wherein said activation layers and conductor layers are formed in contact only with end portions of said cermet resistors.

5. A method of manufacturing a hybrid integrated circuit substrate comprising the steps of:
   preparing an insulating heat-resistant substrate;
   forming activation layers for enabling deposition in electroless plating on being insulating heat-resistant substrate;

forming conductor layers on said activation layers utilizing at least electroless plating; and forming cermet resistors by firing on said insulating heat-resistant substrate in contact with said conductor, wherein said activation layers are made of activation paste containing a catalytic metal for enabling deposition in electroless plating and glass ingredients for attaining adhesion with said insulating substrate upon firing, electrical connection between said conductor layers and said cermet resistors occurring through said activation layers by ohmic contact effected between the cermet resistors and the conductor layers through diffusion layers formed upon firing the activation paste.

6. A method of manufacturing a hybrid integrated circuit substrate in accordance with claim 5, wherein said conductor layers consist of first conductor layers formed on said activation layers by electroless plating and the second conductor layers formed on said first conductor layers by electroplating.

7. A method of manufacturing a hybrid integrated circuit substrate in accordance with claim 6, wherein said second conductor layers are oxidation-resistant layers.

8. The method of claim 6, wherein said first conductor layers consist of base metal.

9. A method of manufacturing a hybrid integrated circuit substrate in accordance with claim 5, wherein said cermet resistors are resistors of ruthenium oxide.

10. The method of claim 5, wherein said activation layers and conductor layers are formed in contact only with end portions of said cermet resistors.

* * * * *